(12) United States Patent
Lin et al.

(10) Patent No.: US 10,804,865 B1
(45) Date of Patent: Oct. 13, 2020

(54) CURRENT INTEGRATOR AND RELATED SIGNAL PROCESSING SYSTEM

(71) Applicant: NOVATEK Microelectronics Corp., Hsin-Chu (TW)

(72) Inventors: Chieh-An Lin, Taipei (TW); Yen-Ru Kuo, Hsinchu County (TW); Jhih-Siou Cheng, New Taipei (TW); Ju-Lin Huang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/729,495

(22) Filed: Dec. 30, 2019

(51) Int. Cl.
*H03M 1/12* (2006.01)
*H03F 3/45* (2006.01)

(52) U.S. Cl.
CPC ... *H03F 3/45188* (2013.01); *H03F 2200/129* (2013.01); *H03F 2200/156* (2013.01); *H03F 2200/231* (2013.01); *H03F 2200/234* (2013.01); *H03F 2200/252* (2013.01); *H03F 2200/267* (2013.01); *H03F 2203/45004* (2013.01); *H03F 2203/45116* (2013.01); *H03F 2203/45152* (2013.01); *H03F 2203/45156* (2013.01); *H03F 2203/45171* (2013.01); *H03F 2203/45174* (2013.01); *H03F 2203/45514* (2013.01)

(58) Field of Classification Search
CPC ........... H03F 3/45188; H03F 2200/231; H03F 2203/45171; H03F 2203/45116; H03F 2200/156; H03F 2203/45156; H03F 2200/129; H03F 2200/267; H03F 2200/252; H03F 2200/234; H03F 2203/45152; H03F 2203/45514; H03F 2203/45004; H03F 2203/45174; H03M 1/12
USPC ........................................................ 341/155
See application file for complete search history.

(56) References Cited

U.S. PATENT DOCUMENTS

| | | | | |
|---|---|---|---|---|
| 4,050,065 | A * | 9/1977 | Mosley | H03M 1/52 341/118 |
| 4,138,649 | A * | 2/1979 | Schaffer | H03F 1/303 330/303 |
| 4,567,465 | A * | 1/1986 | Komiya | H03M 1/52 341/168 |
| 5,841,310 | A * | 11/1998 | Kalthoff | G06G 7/1865 327/337 |
| 5,880,634 | A * | 3/1999 | Babanezhad | H03F 3/45475 327/557 |
| 6,906,648 | B1 * | 6/2005 | Koike | H03M 1/0697 341/118 |
| 7,095,354 | B2 * | 8/2006 | Harrison | H03M 1/0609 341/155 |
| 8,410,962 | B2 * | 4/2013 | Shibata | H03H 11/1204 327/336 |
| 9,065,480 | B1 * | 6/2015 | Tseng | H03M 3/388 |

(Continued)

*Primary Examiner* — Jean B Jeanglaude
(74) *Attorney, Agent, or Firm* — Winston Hsu

(57) ABSTRACT

A current integrator includes an operational amplifier, an integration capacitor and an offset cancelation capacitor. The operational amplifier includes a first input stage and a second input stage. The first input stage is coupled to an input terminal of the current integrator. The integration capacitor is coupled between the first input stage of the operational amplifier and an output terminal of the current integrator. The offset cancelation capacitor is coupled to the second input stage of the operational amplifier.

19 Claims, 6 Drawing Sheets

(56) References Cited

U.S. PATENT DOCUMENTS

| | | | | |
|---|---|---|---|---|
| 2009/0140802 A1* | 6/2009 | Kitagawa | ............ | H03F 3/45475 330/9 |
| 2013/0057331 A1* | 3/2013 | Yuan | ........................ | H04R 3/04 327/341 |
| 2016/0240122 A1* | 8/2016 | Yu | .......................... | G09G 3/006 |
| 2020/0083901 A1* | 3/2020 | Adusumalli | ........ | H03F 3/45928 |

* cited by examiner

CURRENT INTEGRATOR AND RELATED SIGNAL PROCESSING SYSTEM

BACKGROUND OF THE INVENTION

1. Field of the Invention

The present invention relates to a current integrator and a related signal processing system, and more particularly, to a current integrator and a related signal processing system which are applicable for compensation of an organic light-emitting diode (OLED) panel.

2. Description of the Prior Art

An organic light-emitting diode (OLED) is a light-emitting diode (LED) in which the emissive electroluminescent layer is a film of organic compound, where the organic compound can emit light in response to an electric current. OLEDs are widely used in display panels of electronic devices such as television screens, computer monitors, and portable systems such as mobile phones, handheld game consoles and personal digital assistants (PDAs). An active matrix OLED (AMOLED), which is driven by a thin-film transistor (TFT) which contains a storage capacitor that maintains the pixel states to enable large size and large resolution displays, becomes the mainstream of the OLED displays.

After a long-time operation of an OLED panel, several parameters in the OLED panel, such as the threshold voltage of the TFT, may undergo degradations or variations with different extents through different pixels. In order to improve the uniformity of the OLED panel, the variations of these parameters need to be compensated, and the characteristics of the parameters should be sensed in order to determine the compensation degree for each pixel cell. In general, during the sensing process, the information of degradations or variations of the OLED pixels may be read out as a current signal, which is received by a current integrator. The electric charges corresponding to the current signal may be accumulated and stored in a storage capacitor of the current integrator, and then outputted as a signal (e.g., voltage signal or current signal) recognizable by an analog-to-digital converter (ADC). However, the current integrator usually has an operational amplifier, which may be accompanied by an input offset, resulting in an error in the integration result of the current integrator.

An offset cancelation technique is usually applied to solve this problem. In detail, an offset cancelation capacitor is coupled between the differential input terminals of the operational amplifier to realize the offset cancelation purpose, so that the offset may be canceled during the integration process. However, due to non-ideality of the fabrication process and circuit elements, the electric charges stored in the capacitor may be influenced by various factors such as charge injection, clock feedthrough, and leakage currents. These noises may be amplified by the operational amplifier and then coupled to the output terminal of the current integrator. Further, the offset cancelation capacitor should be capable of storing the offset information during the integration period, and thus require enough storage capacity; hence, the size of the capacitor cannot be too small, or otherwise the electric charge associated to the offset may be leaked out during the integration period. The larger size of the offset information capacitor becomes a problem in consideration of cost reduction issue.

SUMMARY OF THE INVENTION

It is therefore an objective of the present invention to provide a novel current integrator and a related signal processing system, in order to solve the abovementioned problems.

An embodiment of the present invention discloses a current integrator, which comprises an operational amplifier, an integration capacitor and an offset cancelation capacitor. The operational amplifier comprises a first input stage and a second input stage. The first input stage is coupled to an input terminal of the current integrator. The integration capacitor is coupled between the first input stage of the operational amplifier and an output terminal of the current integrator. The offset cancelation capacitor is coupled to the second input stage of the operational amplifier.

Another embodiment of the present invention discloses a signal processing system, which comprises an analog-to-digital converter (ADC) and a plurality of current integrators. Each of the plurality of current integrators is coupled to the ADC and comprises an operational amplifier, an integration capacitor and an offset cancelation capacitor. The operational amplifier comprises a first input stage and a second input stage. The first input stage is coupled to an input terminal of the current integrator. The integration capacitor is coupled between the first input stage of the operational amplifier and an output terminal of the current integrator. The offset cancelation capacitor is coupled to the second input stage of the operational amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
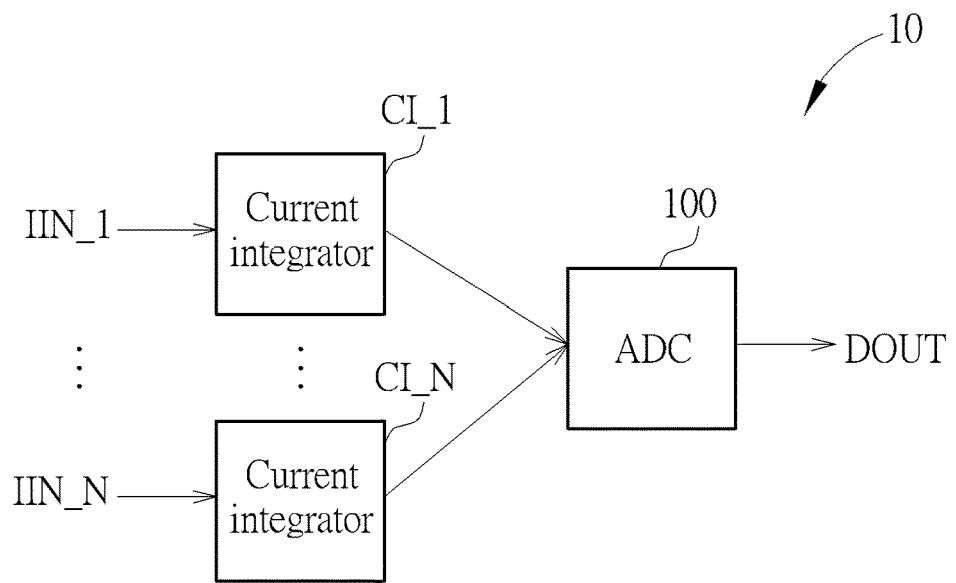
FIG. 1 is a schematic diagram of a signal processing system according to an embodiment of the present invention.

Please refer to FIG. 1, which is a schematic diagram of a signal processing system 10 according to an embodiment of the present invention. The signal processing system 10 may be configured to receive and process input current signals from an organic light-emitting diode (OLED) panel, for performing compensation on various parameters of the OLED panel such as the brightness of OLED and the threshold voltage of the thin-film transistor (TFT). As shown in FIG. 1, the signal processing system 10 includes a plurality of channels, for receiving input current signals IIN_1-IIN_N from different pixels of the OLED panel, respectively. Each channel includes a current integrator CI_1-CI_N, configured to integrate the input current over a specific time period and output the integration result. The signal processing system 10 may include an analog-to-digital converter (ADC) 100, for converting the received integrated current signal into digital output data DOUT. The digital output data DOUT may further be served as compensation information for subsequent image data.

As shown in FIG. 1, the ADC 100 is coupled to each of the current integrators CI_1-CI_N, for receiving output signals from the current integrators CI_1-CI_N by turns. In an embodiment, each channel may further include a switch (not shown in FIG. 1 for brevity) coupled to the output terminal of the current integrator CI_1-CI_N, allowing the ADC to receive the integration results by turns via control of the switches.

Figure 2:
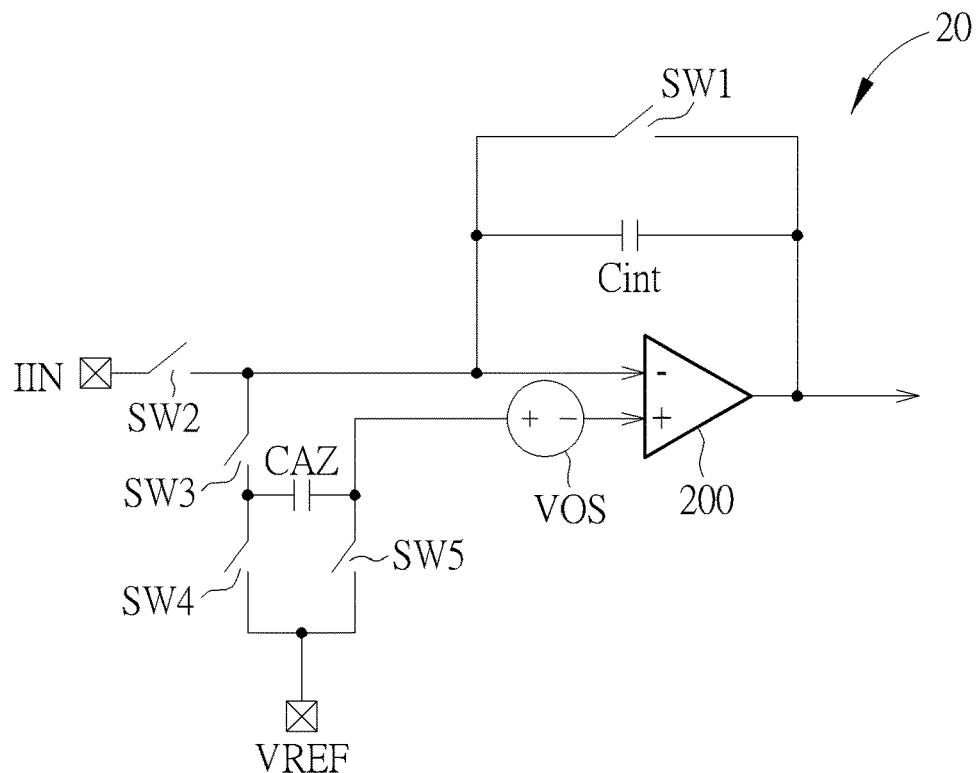
FIG. 2 is a schematic diagram of a general current integrator.

Please refer to FIG. 2, which is a schematic diagram of a general current integrator 20. As shown in FIG. 2, the current integrator 20 includes an operational amplifier 200, an integration capacitor Cint, an offset cancelation capacitor CAZ and switches SW1-SW5. The switches SW1-SW2, the integration capacitor Cint and the operational amplifier 200 cooperate to achieve the integration of current signals. With the switched capacitor operation of the switches SW1-SW2, the operational amplifier 200 may be reset in a phase and configured to receive the input current signal IIN in another phase, where the input current signal IIN may be received and stored in the integration capacitor Cint. Note that the operational amplifier 200 generally has an input offset voltage VOS, which is illustrated as a voltage source in FIG. 2. The offset voltage VOS may cause the integration result to deviate from its accurate value. Further, the operational amplifier 200 of the current integrator 20 in each channel may have different magnitudes of offset values, such that the integration result may be influenced by the offset with different degrees, resulting in poor results of OLED pixel sensing. Therefore, the switches SW3-SW5 and the offset cancelation capacitor CAZ cooperate to cancel the offset voltage VOS. For example, with the switched capacitor operation, the offset information may be stored in the offset cancelation capacitor CAZ in a phase, and then coupled to the output terminal of the current integrator 20 to cancel the offset in another phase. In this case, the operational amplifier 200 includes one differential input stage, in which a negative input terminal receives the input current signal IIN and a positive input terminal receives a reference voltage VREF.

Since the offset cancelation capacitor CAZ is coupled to the input terminal of the operational amplifier 200, the noises on the offset cancelation capacitor CAZ are amplified by the operational amplifier 200 to influence the output signals of the current integrator 20. In addition, the charge injection generated in the switched capacitor circuit of the offset cancelation capacitor CAZ is also amplified by the operational amplifier 200 to be coupled to the output terminal of the current integrator 20 to influence the output result. Further, the offset cancelation capacitor CAZ is configured to store the offset information during an integration period. Thus, the size of the capacitor cannot be too small; otherwise, the electric charge associated to the offset information may be leaked out during the integration period. In such a situation, the offset cancelation capacitor CAZ should have an adequate size. Since each channel of the signal processing system has a current integrator, the offset cancelation capacitor CAZ having larger size results in difficulty on cost reduction.

Figure 3:
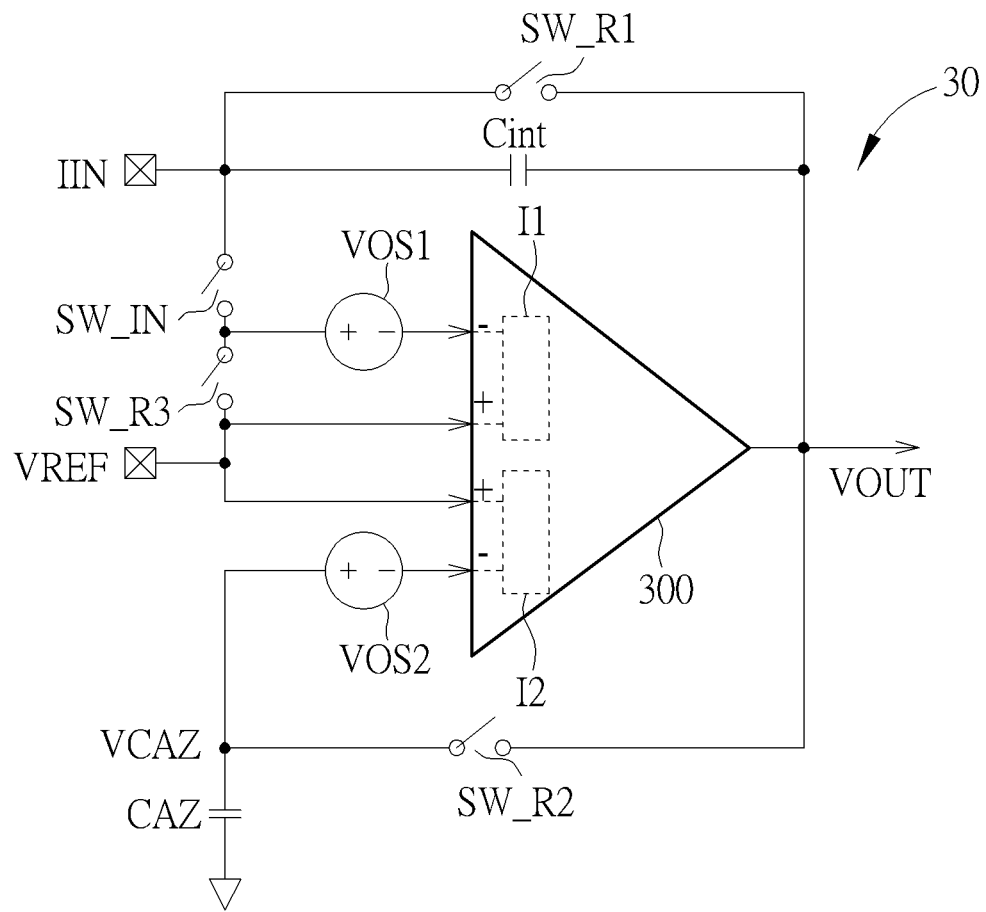
FIG. 3 is a schematic diagram of a current integrator according to an embodiment of the present invention.

In an embodiment, in order to prevent or reduce the influences of the noises and/or deviations in the offset cancelation capacitor CAZ, the offset cancelation capacitor CAZ may be removed from the signal path of the current integrator. Please refer to FIG. 3, which is a schematic diagram of a current integrator 30 according to an embodiment of the present invention. As shown in FIG. 3, the current integrator 30 includes an operational amplifier 300, an integration capacitor Cint, an offset cancelation capacitor CAZ, reset switches SW_R1-SW_R3 and an input switch SW_IN. Different from the operational amplifier 200 in the current integrator 20 having only one input stage, the operational amplifier 300 in the current integrator 30 includes two input stages I1 and I2, each having a differential input pair coupled to two input terminals, respectively. The input stage I1 is coupled to the input terminal of the current integrator 30, for receiving the input current signal IIN from the input terminal. The integration capacitor Cint operates similarly to the integration capacitor Cint shown in FIG. 2, and is thus denoted by the same symbol. As shown in FIG. 3, the integration capacitor Cint is coupled between the input stage I1 of the operational amplifier 300 and the output terminal of the current integrator 30, and configured to store the information of integrating the input current signal IIN. The offset cancelation capacitor CAZ operates similarly to the offset cancelation capacitor CAZ shown in FIG. 2, and is thus denoted by the same symbol. As shown in FIG. 3, the offset cancelation capacitor CAZ is coupled to the input stage I2 of the operational amplifier 300, and configured to store the input offset information of the operational amplifier 300. More specifically, the offset cancelation capacitor CAZ is coupled between the negative input terminal of the input stage I2 and a ground terminal. In this embodiment, the operational amplifier 300 has two input stages I1 and I2, and thus has two input offset voltages VOS1 and VOS2, which are illustrated as voltage sources in FIG. 3.

In addition, the reset switches SW_R1-SW_R3 and the input switch SW_IN are disposed to realize the switched capacitor operations. The input switch SW_IN is coupled between the input stage I1 and the input terminal of the current integrator 30, and it operates similarly to the switch SW2 shown in FIG. 2. The reset switch SW_R1 is coupled between the input stage I1 and the output terminal of the current integrator 30, and it operates similarly to the switch SW1 shown in FIG. 2. Since the operational amplifier 300 has two input stages I1 and I2, another reset switch SW_R2 is disposed to be coupled between the input stage I2 and the output terminal of the operational amplifier 300. A further reset switch is coupled between the two input terminals of the input stage I1.

In this embodiment, the input stage I1 of the operational amplifier 300 is configured to receive the input current signal IIN from the input terminal of the current integrator 30, while the offset cancelation capacitor CAZ, which is coupled to the input stage I2 of the operational amplifier 300, is isolated from the signal path of the current integrator 30 that transmits the input current signal. As for the input stage I1, the negative input terminal is coupled to the input terminal of the current integrator 30, for receiving the input current signal IIN, and the positive input terminal is coupled to a reference terminal, for receiving a reference voltage VREF. As for the input stage I2, the negative input terminal is coupled to the offset cancelation capacitor CAZ, and the positive input terminal is coupled to the same reference terminal, for receiving the reference voltage VREF.

Figure 4A:
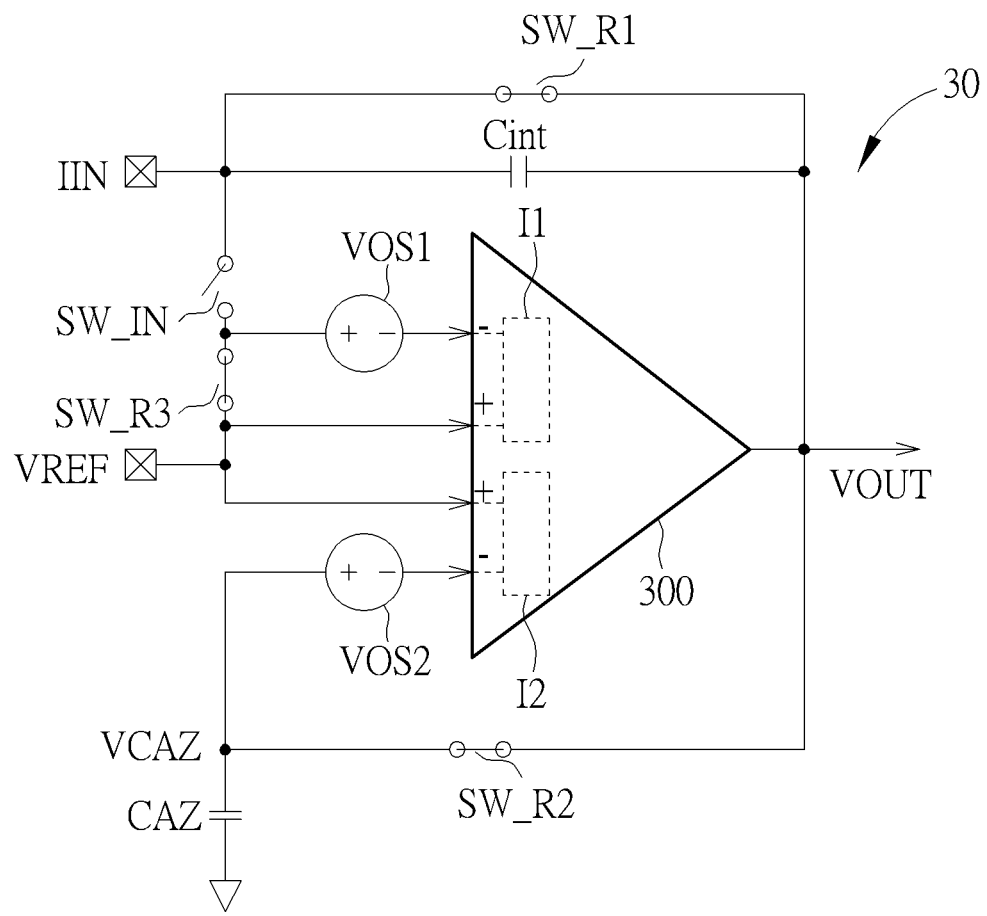
FIG. 4A illustrates the current integrator operating in the offset cancelation phase.

The operations of the current integrator 30 may have two phases: an offset cancelation phase and an integration phase. FIG. 4A illustrates the current integrator 30 operating in the offset cancelation phase. As shown in FIG. 4A, in the offset cancelation phase, the reset switches SW_R1, SW_R2 and SW_R3 are turned on, and the input switch SW_IN is turned off. The turned-on reset switches SW_R1-SW_R3 reset the operational amplifier 300 and allow the information of the input offset voltages VOS1 and VOS2 to be stored in the offset cancelation capacitor CAZ. In the offset cancelation phase, the transfer function of the current integrator 30 may be described as follows:

$$VOUT = VOS1 \cdot Gm1 \cdot Ro + (VOUT + VOS2 - VREF) \cdot Gm2 \cdot Ro;$$

$$VOUT \cong VREF - \frac{VOS1 \cdot Gm1 + VOS2 \cdot Gm2}{Gm2} = VCAZ;$$

wherein VOUT is the output voltage of the operational amplifier 300 (which may also be deemed as the output voltage of the current integrator 30), Gm1 is the transconductance of the input stage I1, Gm2 is the transconductance of the input stage I2, Ro is the output impedance of the operational amplifier 300, and VCAZ is the cross voltage of the offset cancelation capacitor CAZ.

Figure 4B:
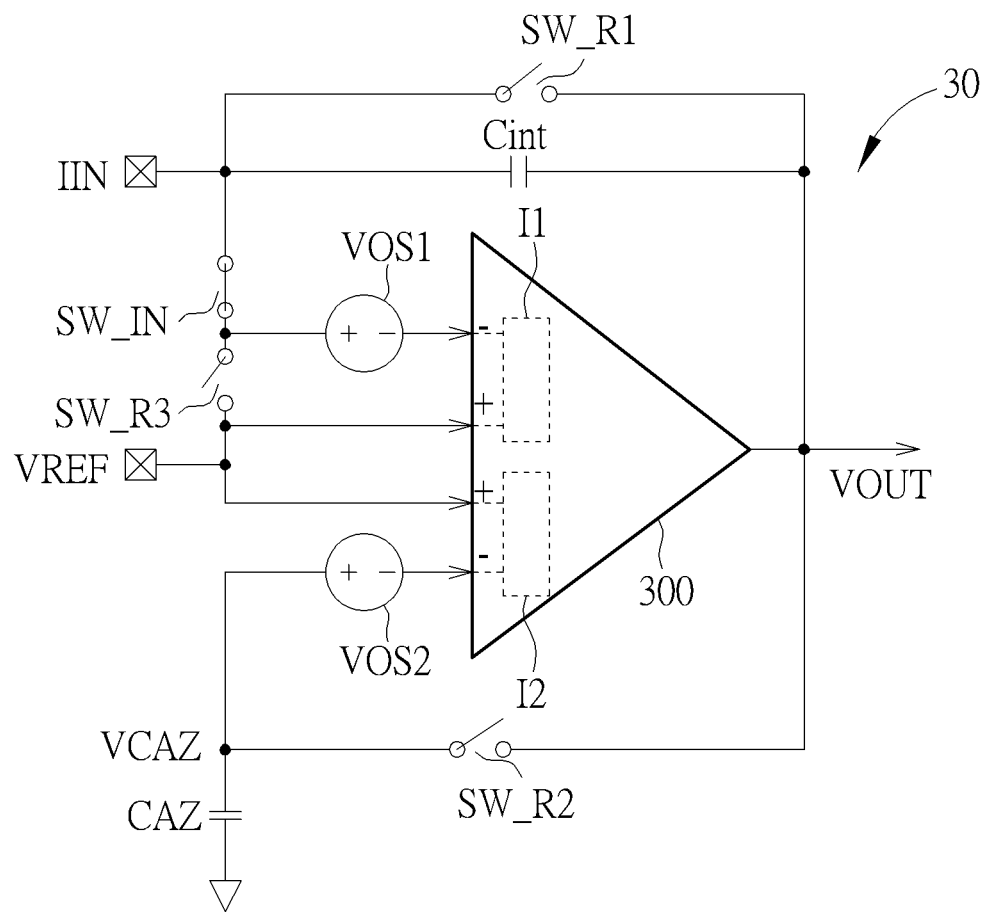
FIG. 4B illustrates the current integrator operating in the integration phase.

FIG. 4B illustrates the current integrator 30 operating in the integration phase. As shown in FIG. 4B, in the integration phase, the input switch SW_IN is turned on, and the reset switches SW_R1, SW_R2 and SW_R3 are turned off. With the turned-on input switch SW_IN, the input current signal IIN may be received and stored in the integration capacitor Cint. The offset information previously stored in the offset cancelation capacitor CAZ may be coupled back to cancel the input offset voltages VOS1 and VOS2. In the integration phase, the transfer function of the current integrator 30 may be described as follows:

$$VOUT = (VCAZ + VOS2 - VREF) \cdot Gm2 \cdot Ro +$$
$$(VOUT + VOS1 - VREF) \cdot Gm1 \cdot Ro;$$
$$VOUT = \frac{VREF \cdot Gm1 \cdot Ro}{Gm1 \cdot Ro - 1} \cong VREF;$$
$$VOUT - VREF = \frac{VREF}{Gm1 \cdot Ro - 1}.$$

As can be seen, the difference of the output voltage VOUT and the reference voltage VREF is divided by Gm1·Ro−1, which is approximately equal to the open loop gain of the operational amplifier 300 and is generally a large value. This means that the influences on the output result of the current integrator 30 generated from the noises, charge injections and/or leakage currents of the offset cancelation capacitor CAZ may be significantly reduced. In comparison, in the general current integrator 20, the operational amplifier 200 includes only one input stage, and thus the noises of the offset cancelation capacitor CAZ may be amplified by the operational amplifier 200 to influence the output result. The main difference is that, the offset cancelation capacitor CAZ of the current integrator 20 is on the signal path, while the offset cancelation capacitor CAZ of the current integrator 30 is not on the signal path where the input current signal IIN is received.

Figure 5A:
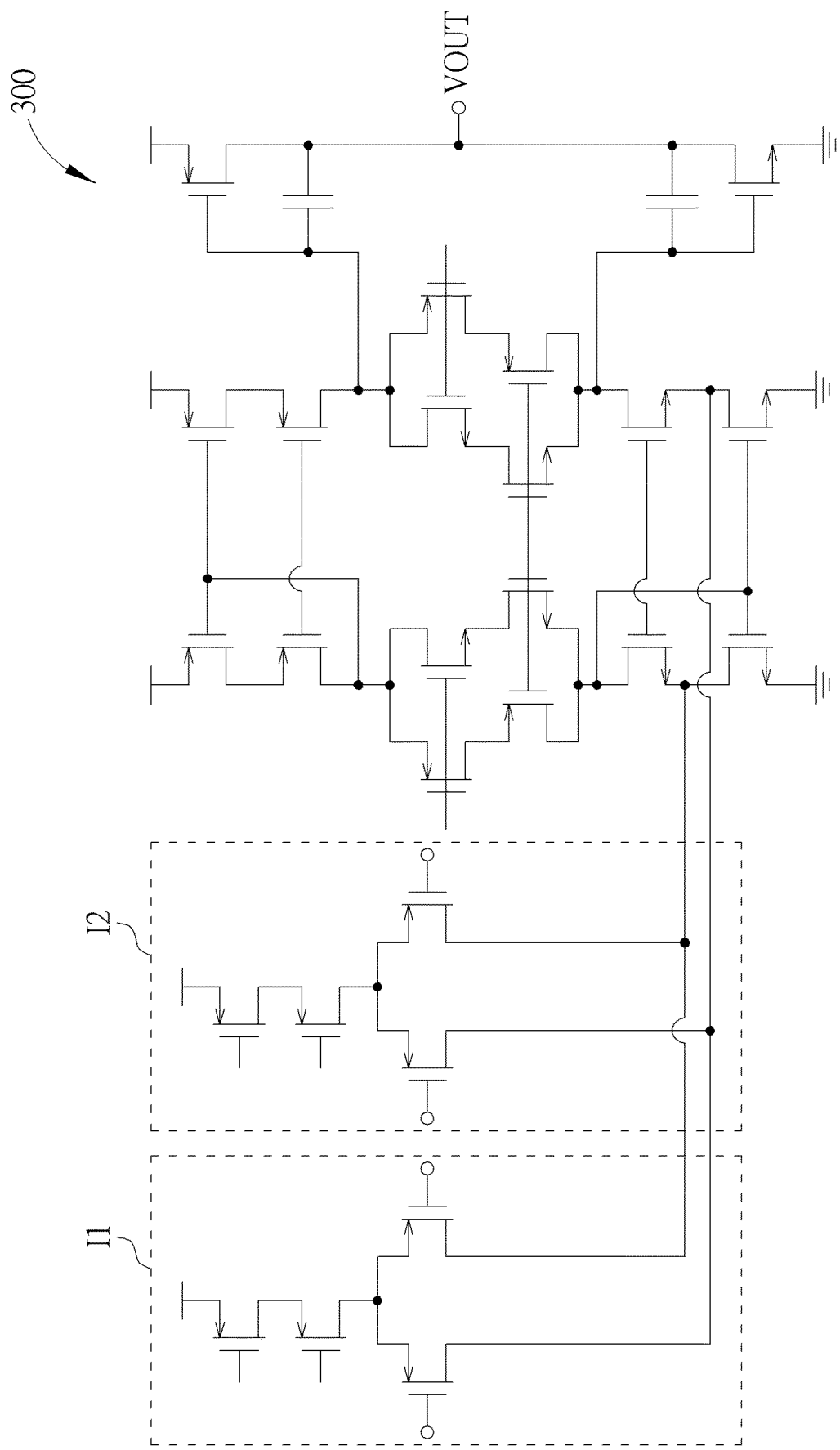
FIGS. 5A and 5B are schematic diagrams of an exemplary circuit structure of the operational amplifier.
Figure 5B:
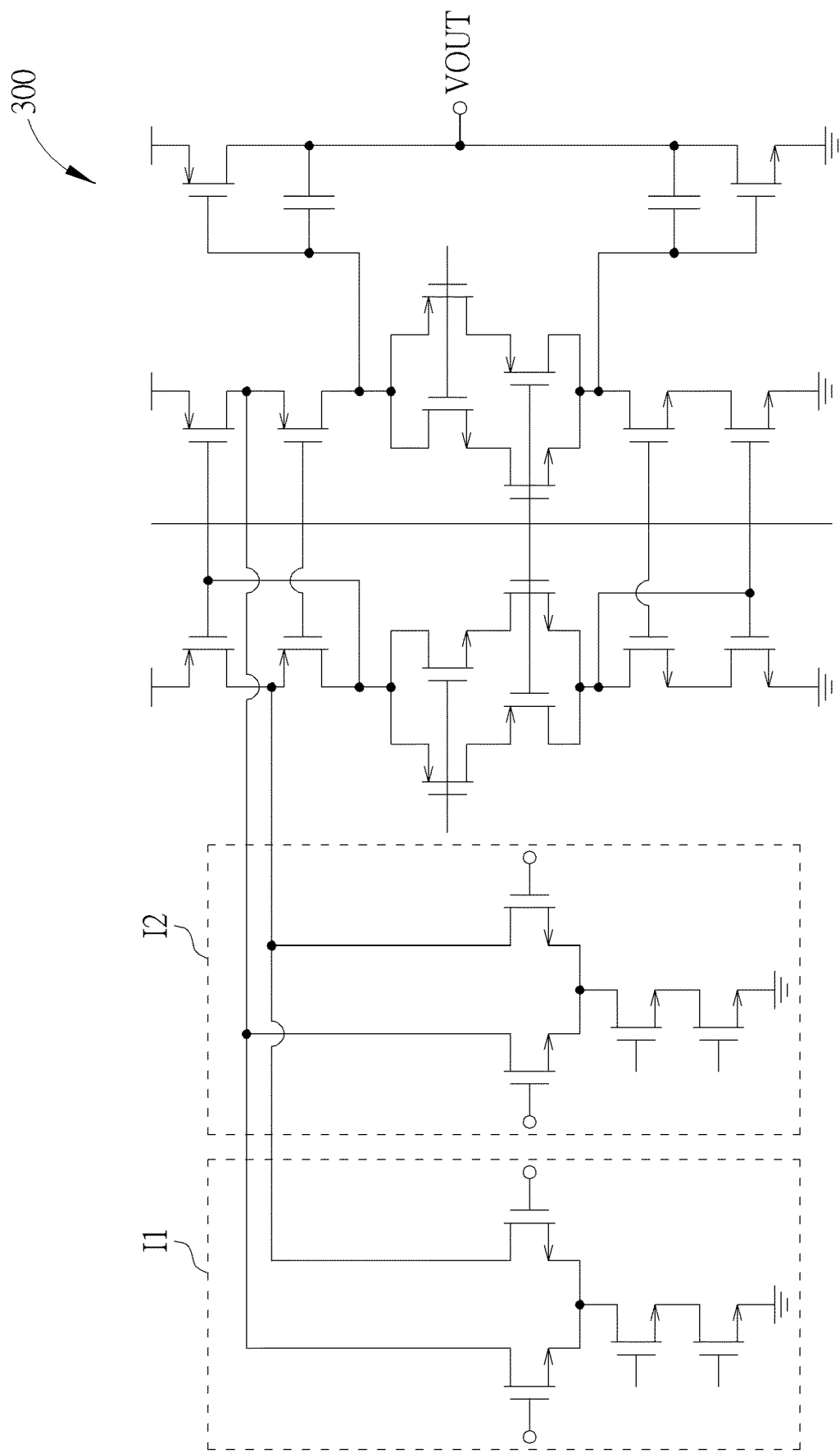

In the present invention, the operational amplifier 300 may be implemented with any type of operational amplifier, as long as the operational amplifier 300 includes two input stages. Please refer to FIGS. 5A and 5B, which are schematic diagrams of an exemplary circuit structure of the operational amplifier 300. As shown in FIG. 5A, the operational amplifier 300 may be, for example, a class-AB amplifier with two input stages I1 and I2, where each input stage I1 or I2 has a differential input pair composed of two P-type metal oxide semiconductor (PMOS) transistors. FIG. 5B illustrates a similar class-AB amplifier, where each differential input pair is composed of two N-type metal oxide semiconductor (NMOS) transistors.

Please note that the present invention aims at providing a current integrator and a related signal processing system for the OLED panel. Those skilled in the art may make modifications and alternations accordingly. For example, in the above embodiments, the current integrator and signal processing system are applicable to the OLED panel, for sensing parameters for compensation in each pixel of the OLED panel. In another embodiment, the current integrator and signal processing system may be applied to any other device that outputs current signals to be accumulated in the current integrator and then readout. In addition, the implementation of the operational amplifier is not limited to the circuit structure described in this disclosure.

To sum up, the present invention provides a current integrator and signal processing system for compensation of the OLED panel. The signal processing system may include multiple channels and each channel has a current integrator. An offset cancelation scheme is required to be implemented in each current integrator, to cancel the input offset of the operational amplifier. In order to reduce various noises and deviations of the offset cancelation capacitor, the offset cancelation capacitor is isolated from the signal path of the current integrator. In an embodiment, the operational amplifier may have two input stages, wherein one input stage is configured to receive the input current signals, and the offset cancelation capacitor is coupled to another input stage. As a result, the influences on the output result of the current integrator generated from the noises and/or deviations of the offset cancelation capacitor may be significantly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A current integrator, comprising:
an operational amplifier, comprising:
a first input stage, coupled to an input terminal of the current integrator; and
a second input stage;
an integration capacitor, coupled between the first input stage of the operational amplifier and an output terminal of the current integrator; and
an offset cancelation capacitor, coupled to the second input stage of the operational amplifier.
2. The current integrator of claim 1, wherein each of the first input stage and the second input stage comprises a differential input pair.
3. The current integrator of claim 1, further comprising:
a first reset switch, coupled between the first input stage of the operational amplifier and the output terminal of the operational amplifier;
a second reset switch, coupled between the second input stage of the operational amplifier and the output terminal of the operational amplifier; and
a third reset switch, coupled between a first input terminal of the first input stage and a second input terminal of the first input stage.

4. The current integrator of claim 1, further comprising:
an input switch, coupled between the first input stage of the operational amplifier and the input terminal of the current integrator.

5. The current integrator of claim 1, wherein the first input stage of the operational amplifier is configured to receive an input current signal from the input terminal of the current integrator.

6. The current integrator of claim 5, wherein the integration capacitor is configured to store information of integrating the input current signal.

7. The current integrator of claim 1, wherein the offset cancelation capacitor is configured to store offset information of the operational amplifier.

8. The current integrator of claim 1, wherein the offset cancelation capacitor is coupled between the second input stage of the operational amplifier and a ground terminal.

9. The current integrator of claim 1, wherein the offset cancelation capacitor is isolated from a signal path of the current integrator.

10. A signal processing system, comprising:
an analog-to-digital converter (ADC); and
a plurality of current integrators, each coupled to the ADC and comprising:
an operational amplifier, comprising:
a first input stage, coupled to one input terminal of the plurality of the current integrators; and
a second input stage;
an integration capacitor, coupled between the first input stage of the operational amplifier and an output terminal of the current integrator; and
an offset cancelation capacitor, coupled to the second input stage of the operational amplifier.

11. The signal processing system of claim 10, wherein each of the first input stage and the second input stage comprises a differential input pair.

12. The signal processing system of claim 10, wherein each of the plurality of current integrators further comprises:
a first reset switch, coupled between the first input stage of the operational amplifier and the output terminal of the operational amplifier;
a second reset switch, coupled between the second input stage of the operational amplifier and the output terminal of the operational amplifier; and
a third reset switch, coupled between a first input terminal of the first input stage and a second input terminal of the first input stage.

13. The signal processing system of claim 10, wherein each of the plurality of current integrators further comprises:
an input switch, coupled between the first input stage of the operational amplifier and the input terminal of the current integrator.

14. The signal processing system of claim 10, wherein the first input stage of the operational amplifier is configured to receive an input current signal from the input terminal of the current integrator.

15. The signal processing system of claim 14, wherein the integration capacitor is configured to store information of integrating the input current signal.

16. The signal processing system of claim 10, wherein the offset cancelation capacitor is configured to store offset information of the operational amplifier.

17. The signal processing system of claim 10, wherein the offset cancelation capacitor is coupled between the second input stage of the operational amplifier and a ground terminal.

18. The signal processing system of claim 10, wherein the offset cancelation capacitor is isolated from a signal path of the current integrator.

19. The signal processing system of claim 10, wherein the ADC is configured to receive output signals from the plurality of current integrators by turns.

* * * * *